United States Patent [19]
Yamazaki

[11] Patent Number: 5,187,563
[45] Date of Patent: Feb. 16, 1993

[54] PHOTOELECTRIC CONVERSION DEVICE WITH AL/CR/TCO ELECTRODE

[75] Inventor: Shunpei Yamazaki, Tokyo, Japan

[73] Assignee: Semiconductor Energy Laboratory Co., Ltd., Kanagawa-ken, Japan

[21] Appl. No.: 244,992

[22] Filed: Aug. 16, 1988

Related U.S. Application Data

[63] Continuation-in-part of Ser. No. 742, Jan. 6, 1987, abandoned.

[30] Foreign Application Priority Data

Jan. 6, 1986 [JP] Japan ................................ 61-1006
Jan. 6, 1986 [JP] Japan ................................ 61-1007

[51] Int. Cl.[5] ................ H01L 23/50; H01L 29/46; H01L 29/16
[52] U.S. Cl. .................................. 257/53; 257/59; 257/751; 257/766
[58] Field of Search ...................... 357/4, 30, 71, 2

[56] References Cited

U.S. PATENT DOCUMENTS

| | | | |
|---|---|---|---|
| 4,405,915 | 9/1983 | Komatsu et al. | 357/2 |
| 4,446,364 | 5/1984 | Hayashi et al. | 357/30 |
| 4,612,559 | 9/1986 | Hitotsuyanagi | 357/4 |
| 4,765,845 | 8/1988 | Takada et al. | 357/30 |

FOREIGN PATENT DOCUMENTS

| | | | |
|---|---|---|---|
| 59-122273 | 7/1984 | Japan | 357/30 |
| 61-199660 | 9/1986 | Japan | 357/30 |

*Primary Examiner*—Jerome Jackson, Jr.
*Attorney, Agent, or Firm*—Sixbey, Friedman, Leedom & Ferguson

[57] ABSTRACT

A photoelectric conversion device is caused to have a quick response against incident light by designing the photosensitive portion in such a way that photocurrent does flow only in the direction perpendicular to a semiconductor layer. The device is comprised of the semiconductor and a pair of electrodes so that the layer and the electrodes have the same area and the same shape.

4 Claims, 8 Drawing Sheets

PHOTOELECTRIC CONVERSION DEVICE WITH AL/CR/TCO ELECTRODE

RELATED APPLICATIONS

This application is a continuation-in-part of U.S. application Ser. No. 000,742, filed Jan. 6, 1987, which is now abandoned.

BACKGROUND OF THE INVENTION

The present invention relates to a photoelectric conversion device.

Figure 1A:
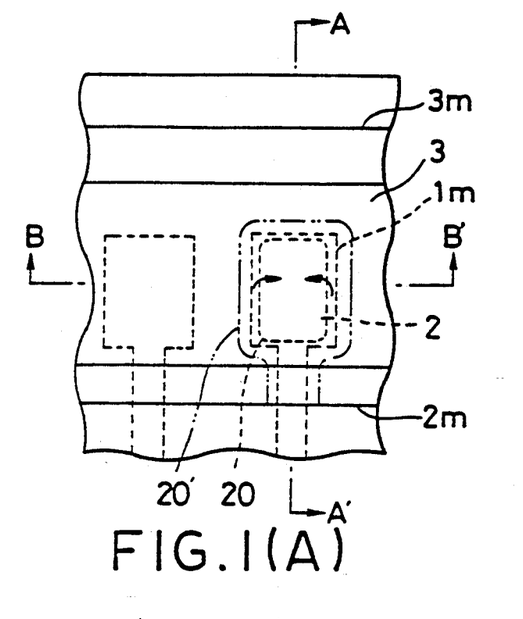
FIGS. 1(A), (B), and (C) show a prior art image sensor.
Figure 1B:
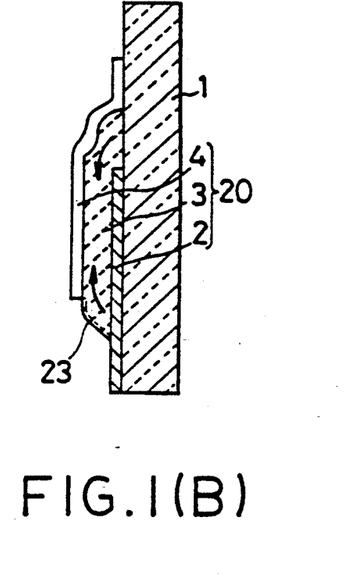
Figure 1C:
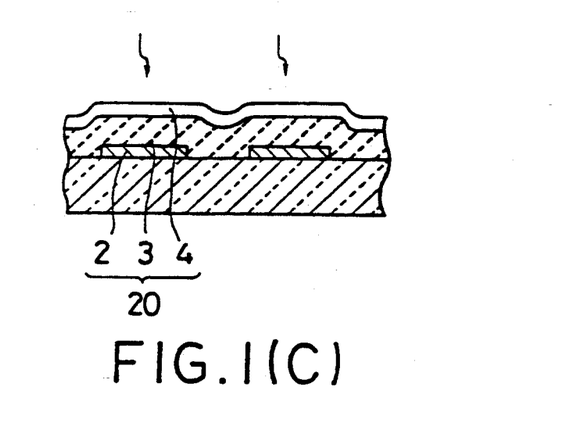

Heretofore a variety of applications of photoelectric conversion devices have been proposed. As an example of such an application, a contact image sensor for a facsimile machine is schematically illustrated in FIG. 1. The sensor is comprised of a photoelectric semiconductor layer 3 provided with a pair of electrodes 2 and 4 on the opposed surfaces, which are fabricated by lithography using three masks.

The fabrication method of this prior art device is as follows. First, a conductive layer of chromium is formed on a substrate 1 and patterned with a first mask 1m to form a plurality of first electrodes 2. Over the patterned electrode 2, a photosensitive intrinsic semiconductor layer of amorphous silicon is deposited to a thickness of 1 micrometer by a glow discharge method and patterned with a second mask 2m of a metal to form a photoelectric conversion layer 3. The amorphous silicon layer is formed in such a way that the patterned layer covers the first electrode 2 sufficiently even with a possible displacement of the mask 2m. Then, a conductive layer of indium tin oxide is formed o the semiconductor layer 3 and patterned with a third mask 3m to form a second electrode 4. A rectifying diode can be formed from a junction (MI junction) between the second electrode 4 and the semiconductor layer 3, i.e. a Schottky barrier.

When light is incident on the semiconductor layer 3 through the second electrode 4 as shown in FIG. 1(C), electron-hole pairs are generated in proportion to the intensity of the incident light.

The image sensor shown in FIGS. 1(A) to 1(C), however, is constructed with the semiconductor layer 3 larger than the first electrodes 2. Because of this, there are generated electron-hole pairs also in the region that is disposed vertically between the opposed electrodes 2 and 4 and lateral drifts of the carriers generated in the region take place as shown in FIGS. 1(A) and 1(B) with arrows. The lateral drift imparts a lag to the response.

On the other hand, the intrinsic semiconductor layer fabricated as described above tends to form a parasitic channel on an exposed surface thereof which is easily transformed into an n-type region, thereby causing a large dark current and dispersion in the quality of products. Further, the use of three masks reduces the cost effectiveness.

SUMMARY OF THE INVENTION

It is therefore an object of the invention to provide improved photoelectric conversion devices and methods for manufacturing the same.

It is another object of the invention to provide improved photoelectric conversion devices and methods for manufacturing the same capable of converting incident light on a real time basis.

It is a further object of the invention to provide improved photoelectric conversion devices and methods for manufacturing the same in which little time lag occurs in response to incident light.

It is still a further object of the invention to provide improved photoelectric conversion devices and methods for manufacturing the same with few parasitic channels on the photoelectric semiconductor of the device.

DETAILED DESCRIPTION OF THE PREFERRED EMBODIMENT

Referring to FIGS. 2(A) to 2(J), an embodiment of the invention is illustrated according to the manufacturing process thereof.

Figure 2A:
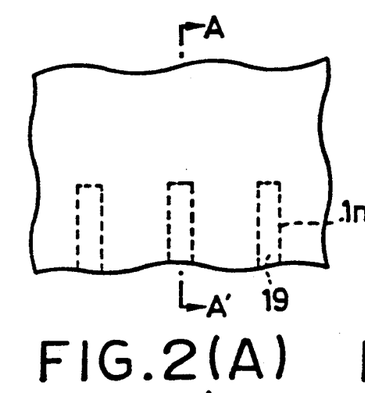
FIGS. 2(A) through 2(J) are plan section views showing a linear contact image sensor in accordance with the present invention.
Figure 2B:
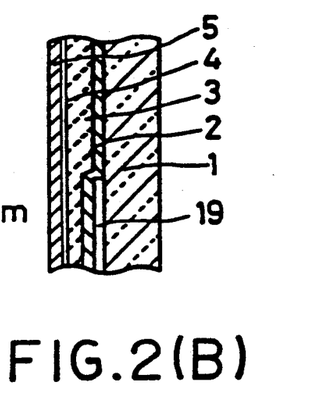

On a heat resistant transparent substrate 1 such as a quartz plate or a Pyrex glass plate, a plurality of transparent electrode strips 19 of tin oxide are formed by using a first photo mask 1m. Further, a first conductive layer 2, a photosensitive semiconductor layer 3, and a second conductive layer 5 are formed in sequence. The first conductive layer 2 is an indium tin oxide layer 2000 A in thickness. The semiconductor layer 3 comprises at least a region of a substantially intrinsic semiconductor, such as an amorphous silicon semiconductor layer incorporating a p-i-n, n-i-n or m-i junction therein, each layer being deposited by a known CVD system. The i-type silicon semiconductor layer apparently has a slight n-type conductivity, so that it may be doped with a p-type impurity such as boron to make the semiconductor substantially intrinsic.

For instance, the semiconductor layer 3 is composed of a 200 A thick p-type semiconductor layer, a 3500 A thick intrinsic semiconductor layer, and a 300 A thick n-type semiconductor layer, which are deposited by a multi-chamber plasma enhanced CVD system (as disclosed in Japanese Patent Application No. Sho 54-104452 by the applicant). In this case, the second conductive layer 5 is formed of chromium of 1000 A thickness and a transparent conductive layer 4 of chromium silicide is formed as a by-product with 10 to 200 A thickness between the semiconductor layer 3 and the chromium layer 5. The chromium silicide buffer layer 4 makes the contact between the semiconductor layer 3 and the electrode 5 ohmic.

Figure 2C:
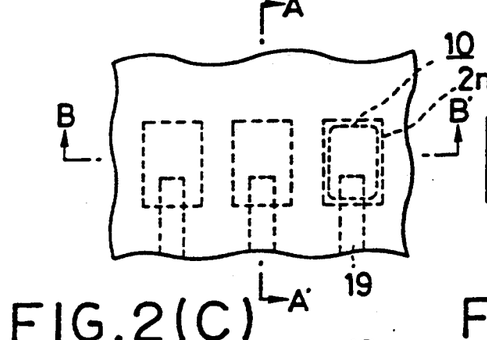
Figure 2D:
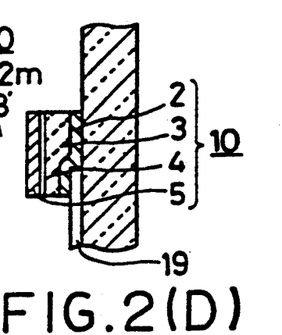
Figure 2E:
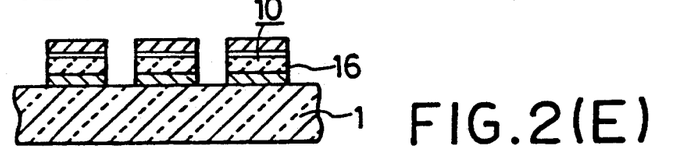

Next, the laminate of the conductive layers 2, 4 and 5 and the semiconductor layer 3 is integrally etched by means of a second mask 2m to produce cell blocks 10 on each strip 19 as shown in FIGS. 2(C), (D) and (E).

The cell blocks 10 constitute the sensitive portion of the contact image sensor, each being 150 micrometers in length and 100 micrometers in width with an interval of 30 micrometers, and are designed into a linear array.

Figure 2F:
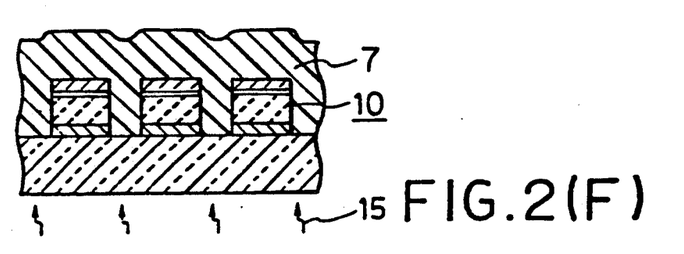
Figure 2G:
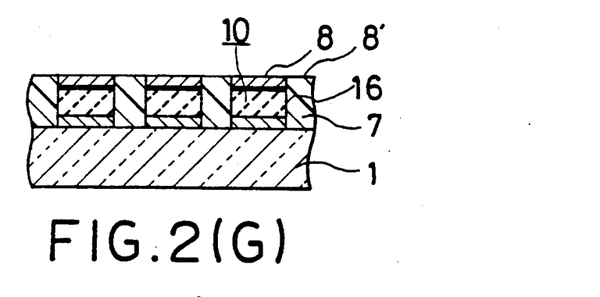

As shown in FIGS. 2(F), a photocurable organic resin layer 7, e.g., an aromatic polyimide precursor solution is formed with 1.6 micrometers thickness by a coating method so as to completely enclose the cell blocks 10. Then, the transparent substrate 1 is pre-baked in a clean oven at 80° C. for an hour and irradiated from the back surface thereof with ultraviolet light by a known mask aligner but using no mask. The irradiation time is about two minutes when an aligner distributed from Cobilt Co is used. After curing, the uncured portion of the resin layer is removed using a suitable rinsing liquid so that the remaining resin layer is nearly flush with the top surface 8 of the cell blocks which are exposed therefore. In this connection, the curing treatment reduces the volume of the resin approximately by a factor of 2, so that the thickness of the resin layer before curing is chosen to be about 1.6 micrometers for the cell blocks with 0.8 micrometer thickness. With ultraviolet light having 300 to 400 nm wavelength (10 mW/cm$^2$), the irradiation time is sufficient to be in the range of 15 to 30 seconds.

Figure 2H:
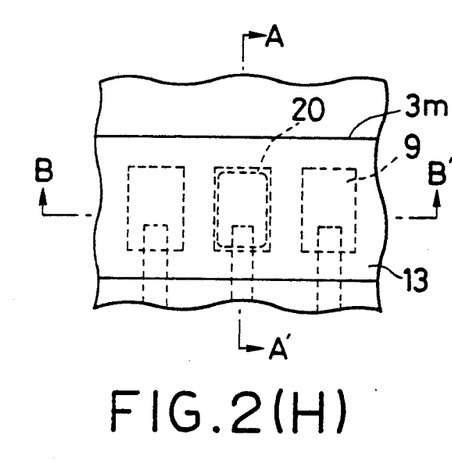
Figure 2I:
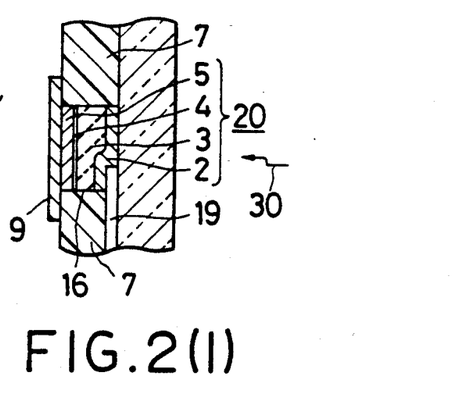
Figure 2J:
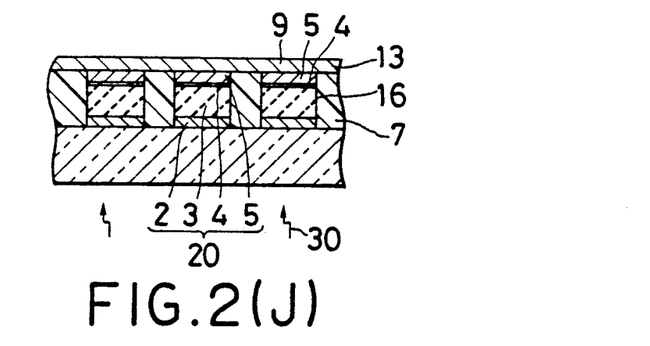

Finally, the substance 1 is heated in a nitrogen atmosphere at 180° C. for 30 minutes, at 300° C. for 30 minutes and at 400° C. for 30 minutes, and an aluminum layer 9 is formed with a thickness of 0.1 to 1.5 micron throughout the upper surface of the substrate 1 and etched by a third photomask 3m in such a way that the remaining aluminum layer traverses and covers over all the cell blocks in contact with the exposed surface of all the cell blocks 10. The aluminum electrode 9 straddles the cell blocks 20 and extends beyond the perimeter of the blocks, and therefore light entering the cell blocks 20 through the back side of the device is completely blocked. Then, the manufacturing of an image sensor with a smooth top surface is completed. For example, the cell blocks can be aligned 8 cells per 1 mm in a line.

The inventor has examined the vicinity of the contact between the cell blocks and the resin layer by an electron microscope in advance of forming the electrode 9. As a result, there have been observed unevenness but no cracks which tend to be a cause of short circuit currents between the opposed electrodes 2 and 5. There also have been observed no projections which might lead to a disconnection of patterns arranged thereon, and the two laterally adjacent layers are recognized as smoothly connected with each other. By virtue of this configuration, it becomes possible to superimpose an ITO (indium tin oxide) layer as the electrode 9 on the underlying layers without causing any possibility of disconnection at the position just above the interface.

The photoelectric conversion element 20 as the cell block thus formed is comprised of the first electrode 2 in contact with the line 19, the semiconductor layer 3, the second electrode 5 and the third electrode 9 in contact with the line 13. The semiconductor layer 3 is completely enclosed with the electrodes on the top and bottom surfaces and the resin layer at the side surfaces so that no current leakage and no parasitic channel takes place on the semiconductor layer.

Further, the opposed electrodes 2 and 5 can have the same area and the same shape as the semiconductor layer 3 regardless of the precision of the patterning.

An example of the photoelectric characteristics obtained by an experiment using a photoelectric device with p-i-n junctions according to the invention will be described hereinbelow. Namely, the dark current with an applied voltage of 3V is $1.8 \times 10^{-13}$ A (the cell area; 100 microns $\times$ 150 microns) and the photo current with an irradiation of 100 Lx is $3.5 \times 10^{-8}$ A. The response characteristics of the device was such that incident light switching over one per microsecond could be followed up. A prior art device as described above could not follow up such a frequent change.

Another experiment was made for a photoelectric device incorporating n-i-n junctions therein. Characteristics of the current passing through the junction versus the applied bias was symmetrical about zero bias. The dark current was $4 \times 10^{-13}$ A and the photo conductivity with reference light of 100 Lx. The device could follow up satisfactorily intermittent irradiation at intervals of 0.2 microsecond.

Figure 2K:
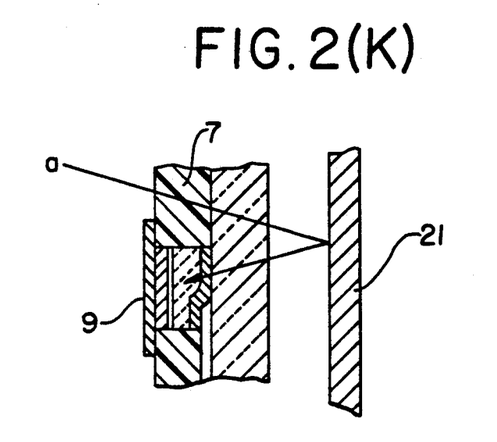
FIGS. 2(K) and 2(L) are section views showing the linear contact image sensor of FIGS. 2(H) through 2(J) in use.

When employed in a copying machine, the structure illustrated in FIGS. 2(H) to 2(J) is used as shown in FIG. 2(K). This structure is very useful for contact-type copying machines. The device receives light rays reflected from an original 21 being copied as depicted by arrow a. Since the original 21 is located very close to the device without an intervening focussing lens, the device is lighted by the rear side, i.e. through the polyimide film 7. The aluminum film 9 functions to block light rays from directly impinging upon the photosensitive layer 3.

Figure 2L:
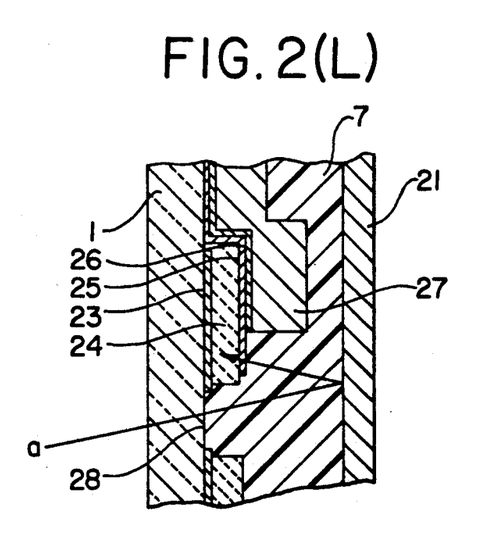

A modification of the above is shown in FIG. 2(L). The photosensor comprises a glass substrate 1, a chromium electrode 23, a photosensitive semiconductor layer 24, an ITO electrode 25, a chromium film 26, an aluminum electrode 27 and polyimide film 7. Adjacent to the semiconductor layer 24, a light window 28 is formed, through which light rays can enter the polyimide film 7 as depicted by arrow a. In the figure, an original 21 makes perfect contact with the surface of the polyimide film during copying operation.

The semiconductor layer 24 is formed with a p-i-n junction. The p or n region of the junction adjacent to the chromium film 23 is made of a silicon carbide semiconductor. Because of this, the influence due to light incident to the end portion of the semiconductor layer 24 opposite to the window 28 is suppressed.

The electrode located at the light incident side, i.e. the aluminum electrode 9 in FIG. 2(K) or the chromium electrode 23 in FIG. 2(L) is formed extending beyond the photosensitive layer. With this configuration, the photosensitive layer is perfectly protected from light rays directly impinging the same from one side.

Although the embodiment described in the above is constructed as a device which receives incident light through the substrate, the invention is also applicable to a device which receives incident light from the reverse side. Another embodiment of this type will be described with reference to FIGS. 3(A) through 3(D). In the manufacturing process for a device of this kind, the same steps as in the process for the previous embodiment can be employed until the step illustrated in FIG. 2(G), so that the process will be described only after said step.

Figure 3A:
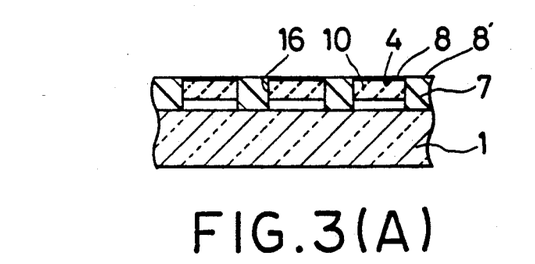
FIGS. 3(A) through 3(D) are plan and section views showing another linear contact image sensor in accordance with the present invention.

After depositing the resin layer 7 in FIG. 2(F), the resin layer 7 and the conductive layer 5 are removed in such a way that the surface of the remaining resin layer is flush with the chromium silicide layer 4 as shown in FIG. 3(A). The removal of the resin layer is carried out in the same manner as in the former embodiment.

Figure 3B:
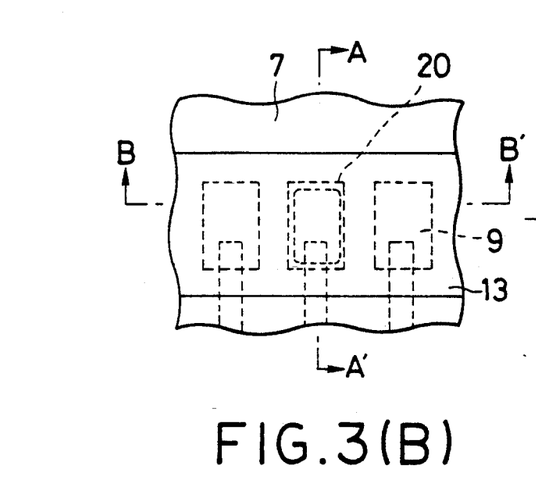
Figure 3C:
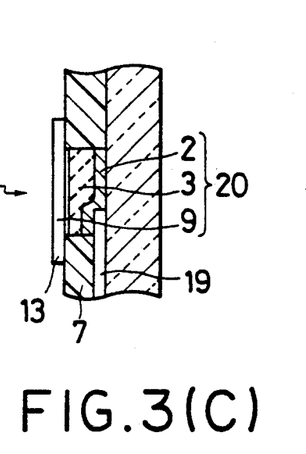
Figure 3D:
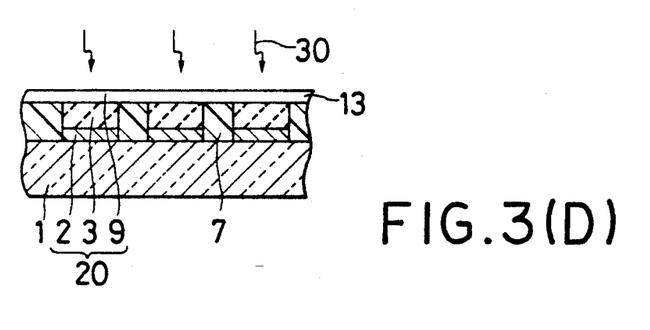

Finally, the substrate 1 is heated in a nitrogen atmosphere at 180° C. for 30 minutes, at 300° C. for 30 minutes and at 400° C. for 30 minutes, and an aluminum layer 9 is formed to a thickness of 0.1 to 1.5 micron throughout the upper surface of the substrate 1 and etched by a third photomask 3m in such a way that the remaining aluminum layer traverses and covers over all the cell blocks in contact with the exposed surface of all the cell blocks 10 as shown in FIGS. 3(B), 3(C) and 3(D). The aluminum electrode 9 straddles the cell blocks 20 and extends beyond the perimeter of the blocks, and therefore light entering the cell blocks 20 through the back side of the device is completely blocked. Then, the manufacturing of an image sensor with a smooth top surface is completed. For example, the cell blocks can be aligned eight cells per 1 mm of a line.

FIGS. 4(A) to 4(J) show a further embodiment of the invention in which cell blocks are arranged in a matrix. The embodiment demonstrates a two-dimensional contact image sensor.

Figures 4A, 4B:
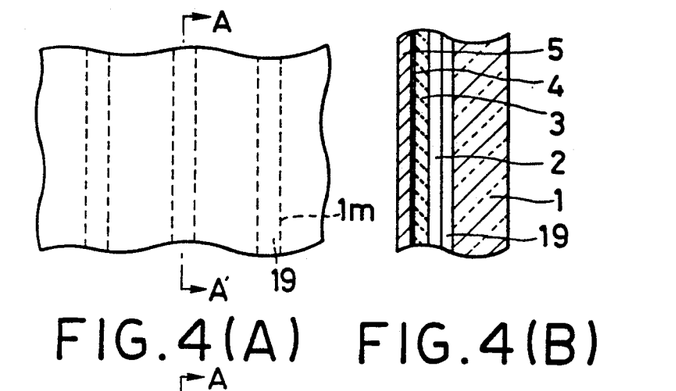
FIGS. 4(A) through 4(J) are plan section views showing a two-dimensional contact image sensor in accordance with the present invention.

On a heat resisting transparent substrate 1 such as a quartz plate or a Pyrex glass plate, a plurality of transparent electrode strips 19 of tin oxide are formed by using a first photo mask 1m. Further, a first conductive layer 2, a photosensitive semiconductor layer 3, and a second conductive layer 5 are formed in sequence. The first conductive layer is an indium tin oxide layer 2000 A in thickness. The semiconductor layer comprises at least a region of a substantially intrinsic semiconductor, such as an amorphous silicon semiconductor layer incorporating a p-i-n, n-i-n or m-i junction therein, each layer being deposited by a known CVD system. The silicon semiconductor layer apparently has a slight n-type conductivity, so that it may be dope with a p-type impurity such as boron to make the semiconductor substantially intrinsic.

For instance, the semiconductor layer is composed of a 200 A thick p-type semiconductor layer, a 3500 A thick intrinsic semiconductor layer and a 300 A thick n-type semiconductor layer, which are deposited by a multi-chamber plasma enhanced CVD system (.as disclosed by Japanese Patent Application No. Sho 54-104452 by the applicant). In this case, the second conductive layer 5 is formed of chromium of 1000 A thickness and a transparent conductive layer 4 of chromium silicide is formed as a by-product with 10 to 200 A thickness between the semiconductor layer 3 and the chromium layer 5. The chromium silicide buffer layer 4 makes the contact between the semiconductor layer 3 and the electrode 5 ohmic.

Figure 4C:
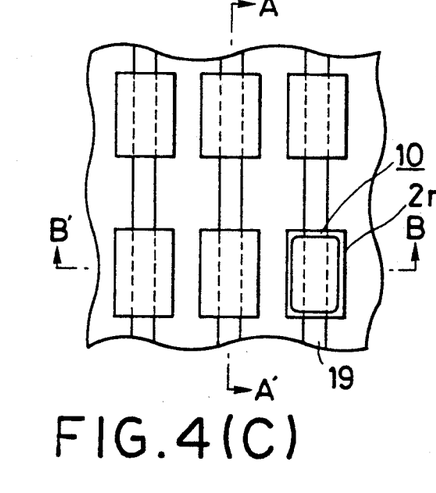
Figure 4D:
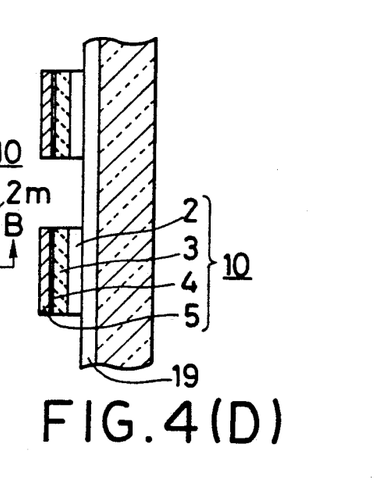
Figures 4E, 4F:
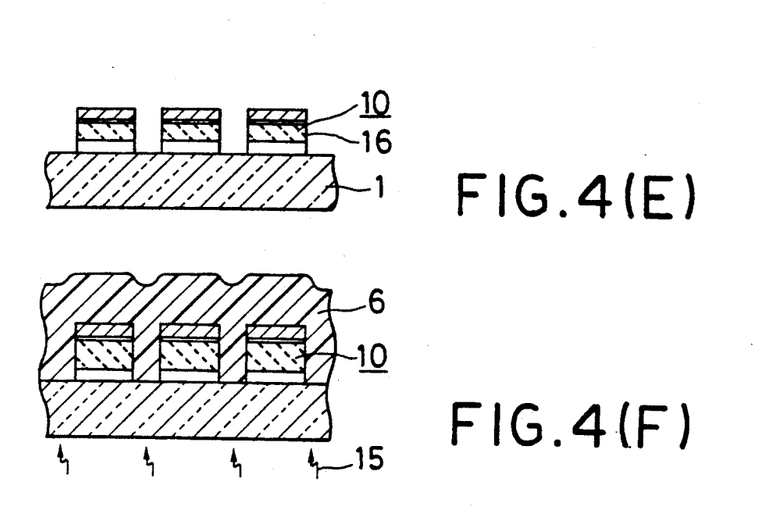
Figure 4G:
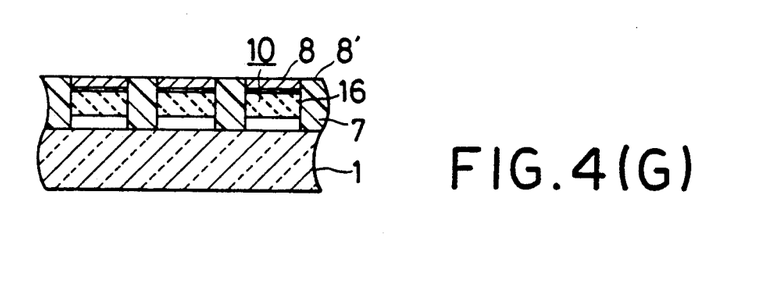

Next, the laminate of the conductive layers 2, 4 and 5 and the semiconductor layer 3 is integrally etched by means of a second mask 2m to produce a plurality of cell blocks 10 on each strip 19 as shown in FIGS. 4(C), 4(D) and 4(E).

The cell blocks 10 are arranged in the form of a matrix, in order to constitute a two-dimensional contact image sensor. The cell blocks 10 are the sensitive portion of the contact image sensor, each being 150 micrometers long and 100 micrometer wide with an interval of 30 micrometers.

As shown in FIG. 4(F), a photocurable organic resin layer 6, e.g., an aromatic polyimide precursor solution is formed with 1.6 micrometers thickness by a coating method so as to completely enclose the cell blocks 10. The, the transparent substrate 1 is pre-baked in a clean oven at 80° C. for an hour and irradiated from the back surface thereof with ultraviolet light by a known mask aligner but using no mask. The irradiation time is about two minutes when an aligner distributed form Cobilt Co is used. After curing, the uncured portion of the resin layer is removed using a suitable rinsing liquid so that the remaining resin layer 6 is nearly flush with the top surface of the cell blocks which, therefore, are exposed. In this connection, the curing treatment reduces the volume of the resin approximately by a factor of 2, so that the thickness of the resin layer before curing is chosen to be about 1.6 micrometer for cell blocks with 0.8 micrometer thickness. With ultraviolet light having 300 to 400 nm wavelength (10 mW/cm$^2$), the irradiation time is sufficient to be in the range of 15 to 30 seconds.

Figure 4H:
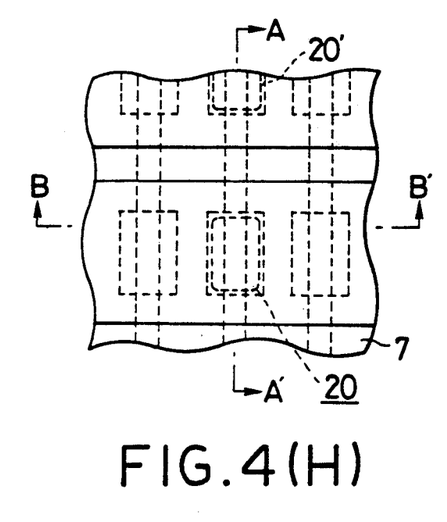
Figure 4I:
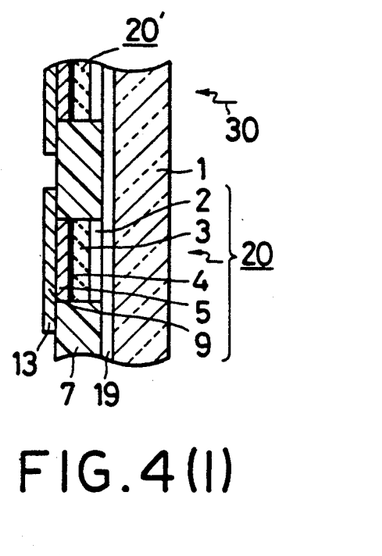
Figure 4J:
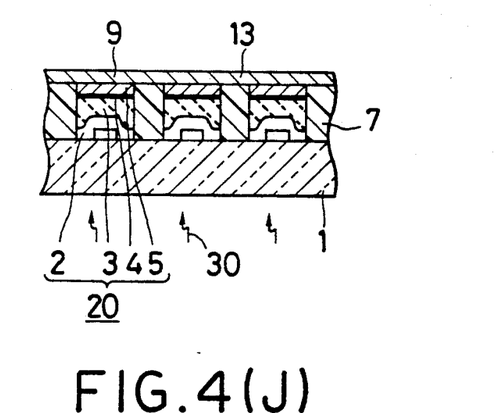

Finally, the substrate 1 is heated in a nitrogen atmosphere at 180° C. for 30 minutes, at 300° C. for 30 minutes and at 400° for 30 minutes, and a plurality of separate aluminum layers 9 are formed to a thickness of 0.1 to 1.5 microns throughout the upper surface of the substrate 1 and etched by a third photomask 3m in such a way that the block in each row of the matrix are covered completely by one of the aluminum layers which remain separately extending along rows of the matrix. The aluminum electrode 9 straddles the cell blocks 20 and extends in the column direction beyond the perimeter of the blocks, and therefore light entering the cell blocks 20 through the back side of the device is completely blocked. Then, the manufacturing of an image sensor with a smooth top surface is completed. For example, the cell blocks can be formed to a density of 64 cells per square millimeter.

The photoelectric conversion element 20 as the cell block thus formed is comprised of the first electrode 2 in contact with the line 19, the semiconductor layer 3, the second electrode 4 and the third electrode 5 in contact with the line 13. The semiconductor layer 3 is completely enclosed with the electrodes at the top and bottom surfaces and the resin layer at the side surfaces so that no current leakage occurs and no parasitic channels form on the semiconductor.

Further, the opposed electrodes 2 and 5 can have the same area and the same shape as the semiconductor layer 3 regardless of the precision of the patterning.

As described in the above, a device according to the present invention is comprised of laminated layers in which the peripheries thereof are surrounded respectively by a resin layer. The upper surface of the laminate is exposed as if the resin layer is not provided. Although the surfaces of the laminate and the resin layer are configured preferably flush with each other, the resin layer may be formed with its upper surface positioned lower than that of the member.

The present invention is useful especially for an image sensor because a number of sensor elements can be finely disposed on a substrate without causing crosstalk between adjacent ones and because the sensor elements maintain high reliability for a long time and have a high abrasion resistance against external impacts.

It should be understood that the present invention is not limited to the specified embodiment but only to the appending claims, and a variety of modifications and changes of the embodiments may occur to those skilled in the art.

Although the embodiments have been described as to contact image sensors, the present invention can be applied also to photoelectric conversion devices of other types which have only one or a few conversion elements. A photoelectric conversion semiconductor layer can incorporate p-i, n-i, m-i (Schottky contact), n-i- or m-i-n junctions, besides p-i-n or n-i-n junctions. The semiconductor substance to be used for the invention may be $Si_xGe_{1-x}(0 < X \leq 1)$, $Si_xC_{1-x}(0 < X \leq 1)$ or $Si_xSn_{1-x}(0 < X \leq 1)$.

What is claimed is:

1. A semiconductor device comprising:
   a non-single crystalline semiconductor layer;
   a indium-tin oxide layer formed on the semiconductor layer; and
   an Al electrode formed on said indium-tin oxide layer, wherein a chromium layer is interposed between the indium-tin oxide layer and the Al electrode.

2. A semiconductor device comprising:
   a non-single crystalline semiconductor layer;
   a transparent conductive oxide layer formed on the semiconductor layer; and
   an Al electrode formed on said transparent conductive oxide layer, wherein a chromium layer is interposed between the transparent conductive oxide layer and the Al electrode.

3. A semiconductor device as in claim 1 where the semiconductor device is an image sensor.

4. A semiconductor device as in claim 2 where the semiconductor device is an image sensor.

* * * * *